(12) United States Patent
Fukushima et al.

(10) Patent No.: US 8,608,902 B2
(45) Date of Patent: *Dec. 17, 2013

(54) PLASMA PROCESSING APPARATUS

(75) Inventors: Kohei Fukushima, Oshu (JP); Toshiki Takahashi, Oshu (JP); Hiroyuki Matsuura, Oshu (JP); Yutaka Motoyama, Oshu (JP); Kazuya Yamamoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 896 days.

This patent is subject to a terminal disclaimer.

(21) Appl. No.: 12/686,060

(22) Filed: Jan. 12, 2010

(65) Prior Publication Data

US 2010/0186898 A1 Jul. 29, 2010

(30) Foreign Application Priority Data

Jan. 23, 2009 (JP) ................. 2009-013703
Feb. 27, 2009 (JP) ................. 2009-046729
Oct. 22, 2009 (JP) ................. 2009-243104

(51) Int. Cl.
*H01L 21/306* (2006.01)
*C23C 16/00* (2006.01)

(52) U.S. Cl.
USPC ............... 156/345.48; 118/723 I; 118/723 IR

(58) Field of Classification Search
USPC ....... 118/723 I, 723 IR, 723 AN; 156/345.48, 156/345.49; 315/111.51
See application file for complete search history.

(56) References Cited

U.S. PATENT DOCUMENTS

| | | | |
|---|---|---|---|
| 5,487,785 A | 1/1996 | Horiike et al. | |
| 5,681,393 A | 10/1997 | Takagi | |
| 5,681,418 A | 10/1997 | Ishimaru | |
| 5,763,851 A * | 6/1998 | Forster et al. | 219/121.43 |
| 5,820,947 A | 10/1998 | Itoh | |
| 5,883,016 A | 3/1999 | Chan et al. | |
| 6,056,848 A | 5/2000 | Daviet | |
| 6,087,778 A * | 7/2000 | Benjamin et al. | 315/111.51 |
| 2003/0029833 A1 | 2/2003 | Johnson | |

(Continued)

FOREIGN PATENT DOCUMENTS

| | | |
|---|---|---|
| CN | 101010786 A | 8/2007 |
| EP | 0 489 407 A2 | 6/1992 |

(Continued)

OTHER PUBLICATIONS

Chinese Office Action issued on Aug. 4, 2010 in Chinese Application No. 200810171431.9 (with English translation).

(Continued)

*Primary Examiner* — Luz Alejandro Mulero
(74) *Attorney, Agent, or Firm* — Oblon, Spivak, McClelland, Maier & Neustadt, L.L.P.

(57) ABSTRACT

A vertical plasma processing apparatus for performing a plasma process on a plurality of target objects together at a time includes an activation mechanism configured to turn a process gas into plasma. The activation mechanism includes a vertically elongated plasma generation box attached to a process container at a position corresponding to a process field and confining a plasma generation area airtightly communicating with the process field, an ICP electrode disposed outside the plasma generation box and extending in a longitudinal direction of the plasma generation box, and an RF power supply connected to the ICP electrode. The ICP electrode includes a separated portion separated from a wall surface of the plasma generation box by a predetermined distance.

17 Claims, 15 Drawing Sheets

(56) References Cited

U.S. PATENT DOCUMENTS

| | | |
|---|---|---|
| 2005/0093460 A1 | 5/2005 | Kim et al. |
| 2005/0199343 A1 | 9/2005 | Ohkuni |
| 2006/0032443 A1 | 2/2006 | Hasebe et al. |
| 2006/0266291 A1 | 11/2006 | Song et al. |
| 2006/0286817 A1 | 12/2006 | Kato et al. |
| 2007/0243338 A1 | 10/2007 | Aslami et al. |
| 2008/0093024 A1* | 4/2008 | Abe et al. ............... 156/345.44 |
| 2008/0286980 A1* | 11/2008 | Ishimaru ..................... 438/716 |
| 2009/0056877 A1* | 3/2009 | Matsuura et al. ....... 156/345.48 |

FOREIGN PATENT DOCUMENTS

| | | | |
|---|---|---|---|
| JP | 4-290428 | | 10/1992 |
| JP | 6-275608 | | 9/1994 |
| JP | 11-317299 | A | 11/1999 |
| JP | 2002-280378 | | 9/2002 |
| JP | 2005-142568 | | 6/2005 |
| JP | 2006-073913 | * | 3/2006 |
| JP | 2006-270016 | | 10/2006 |
| JP | 2006-303431 | A | 11/2006 |
| JP | 2007-42823 | | 2/2007 |
| JP | 2008-53504 | A | 3/2008 |
| JP | 2008-300444 | A | 12/2008 |
| KR | 10-2005-0042701 | | 5/2005 |
| KR | 10-2007-0057165 | | 6/2007 |
| WO | WO 2004/108980 | | 12/2004 |
| WO | WO 2006/027972 | A1 | 3/2006 |
| WO | WO 2006/093136 | | 9/2006 |
| WO | WO 2006/093136 | A1 | 9/2006 |

OTHER PUBLICATIONS

Korean Office Action issued on Jun. 30, 2011 in Application No. 10-2008-0084805 (with partial English translation).
Japanese Office Action issued Feb. 21, 2012 in patent application No. 2008-203574 (with partial English translation).

* cited by examiner

PLASMA PROCESSING APPARATUS

BACKGROUND OF THE INVENTION

1. Field of the Invention

The present invention relates to a plasma processing apparatus for performing a process, such as a film formation process or etching process, by use of plasma on target objects, such as semiconductor wafers, and particularly to a technique utilized in the semiconductor process field. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

In manufacturing semiconductor devices for constituting semiconductor integrated circuits, a target object, such as a semiconductor wafer, is subjected to various processes, such as film formation, etching, oxidation, diffusion, reformation, annealing, and natural oxide film removal. US 2006/0286817 A1 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rate, process pressure, and process temperature, are controlled.

In order to improve the characteristics of semiconductor integrated circuits, it is important to improve the properties of insulating films used for semiconductor devices. Conventionally, $SiO_2$ films are mainly used as insulating films for semiconductor devices. However, in recent years, semiconductor integrated circuits are required to satisfy further improved integration and miniaturization levels. Under the circumstances, silicon nitride films ($Si_3N_4$ films) are used as insulating films for oxidation-resistant films, impurity-diffusion prevention films, and/or sidewall films of gate devices. Silicon nitride films are low in impurity diffusion coefficient and high in oxidation barrier property, and thus are extremely suitable for insulating films used in the applications described above.

Further, in recent years, semiconductor integrated circuits are required to have a higher operation speed. Owing to this demand, there is a proposal in which a silicon nitride film doped with an impurity, such as boron B, is formed to provide an insulating film having a far smaller dielectric constant that decreases the parasitic capacitance to a large extent (Jpn. Pat. Appln. KOKAI Publication No. 6-275608).

In addition to the demand described above, it is necessary to lower the temperature of processes. Owing to this demand, there has been proposed a plasma processing apparatus that performs a process by use of plasma to promote a reaction even at a lower wafer temperature (Jpn. Pat. Appln. KOKAI Publications No. 2006-270016 and No. 2007-42823).

FIG. 20 is a view schematically showing a vertical plasma processing apparatus, which is one of the conventional apparatuses described above. FIG. 21 is a sectional view showing part of a plasma box used in the apparatus shown in FIG. 20. As shown in FIG. 20, a cylindrical process container made of quartz and configured to vacuum-exhaust the internal atmosphere is disposed to accommodate semiconductor wafers (not shown) arrayed at intervals in the vertical direction.

A plasma generation box 4 having a rectangular shape in a cross section is attached to the sidewall of a process container 2 along the vertical direction. A gas nozzle 5 for supplying a gas to be activated by plasma is disposed inside the box 4. As shown also in FIG. 21, two distinct plasma electrodes 6 are disposed to extend in the vertical direction on opposite sides outside the wall that defines the plasma generation box 4. An RF (radio frequency) power with, e.g., 13.56 MHz for plasma generation is applied across the two plasma electrodes 6 from an RF power supply 8.

With the arrangement described above, the two plasma electrodes 6 render an electrode pair of the parallel-plate type, so that plasma is generated by capacitive coupling when an RF power is applied across the plasma electrodes 6. The plasma thus generated activates a gas supplied into the plasma box 4, thereby generating active species or radicals that promote the reaction and so forth. A plasma processing apparatus of this type is generally called a plasma processing apparatus of the CCP (Capacitively Coupled Plasma) type.

According to a plasma processing apparatus of the CCP type, a reaction for, e.g., film formation is promoted by assistance of plasma, and so a predetermined plasma process can be performed even at a relatively low wafer temperature. However, the present inventors have found that plasma processing apparatuses of this type entail problems concerning particle generation and radical generation amount.

BRIEF SUMMARY OF THE INVENTION

An object of the present invention is to provide a plasma processing apparatus that can prevent particle generation and can increase radical generation amount.

According to a first aspect of the present invention, there is provided a vertical plasma processing apparatus for performing a plasma process on a plurality of target objects together at a time, the apparatus comprising: a vertically elongated process container having a process field configured to accommodate the target objects and to be set in an airtightly state; a holder configured to support the target objects at intervals in a vertical direction inside the process container; a gas supply system configured to supply a process gas into the process container; an exhaust system configured to exhaust gas from inside the process container; and an activation mechanism configured to turn the process gas into plasma, wherein the activation mechanism comprises a vertically elongated plasma generation box attached to the process container at a position corresponding to the process field and confining a plasma generation area airtightly communicating with the process field, an ICP (inductively coupled plasma) electrode disposed outside the plasma generation box and extending in a longitudinal direction of the plasma generation box, the ICP electrode including a separated portion separated from a wall surface of the plasma generation box by a predetermined distance, and an RF (radio frequency) power supply connected to the ICP electrode.

According to a second aspect of the present invention, there is provided a vertical plasma processing apparatus for performing a plasma process on a plurality of target objects together at a time, the apparatus comprising: a vertically elongated process container having a process field configured to accommodate the target objects and to be set in an airtightly state; a holder configured to support the target objects at intervals in a vertical direction inside the process container; a gas supply system configured to supply a first process gas and a second process gas into the process container, and comprising a first gas distribution nozzle, which is disposed along the process field to supply the first process gas, and having a plurality of gas spouting holes formed therein at intervals in a vertical direction; an exhaust system configured to exhaust gas from inside the process container, and comprising a vertically elongated exhaust port formed in the process container at a position opposite to the first gas distribution nozzle; and an activation mechanism configured to turn into plasma the second process gas being supplied from the gas supply system to the process field, wherein the activation mechanism comprises vertically elongated first and second plasma generation boxes attached to the process container at a position corresponding to the process field and each confining a plasma generation area airtightly communicating with the process field, the first and second plasma generation boxes respectively including vertically elongated openings facing the process field and formed therein at positions on both sides of the first gas distribution nozzle and opposite to the exhaust port, first and second ICP (inductively coupled plasma) electrodes respectively disposed outside the first and second plasma generation boxes and extending in a longitudinal direction of the first and second plasma generation boxes, and a common RF (radio frequency) power supply connected to the first and second ICP electrodes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

In the process of developing the present invention, the inventors studied problems of conventional techniques concerning plasma processing apparatuses of the capacitively coupled plasma type. As a result, the inventors have arrived at the findings given below.

Figure 20:
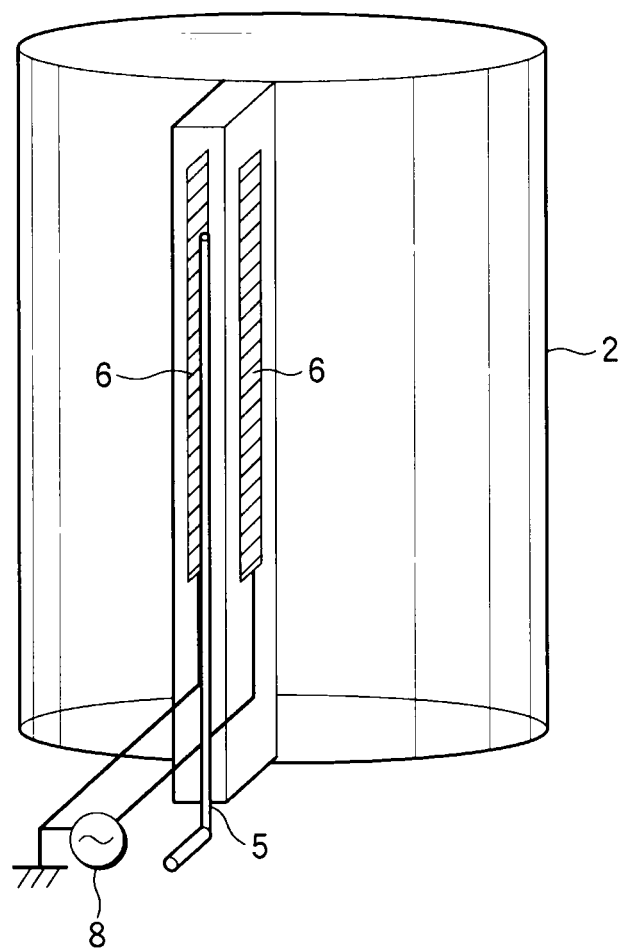
FIG. 20 is a view schematically showing a vertical plasma processing apparatus conventionally used.
Figure 21:
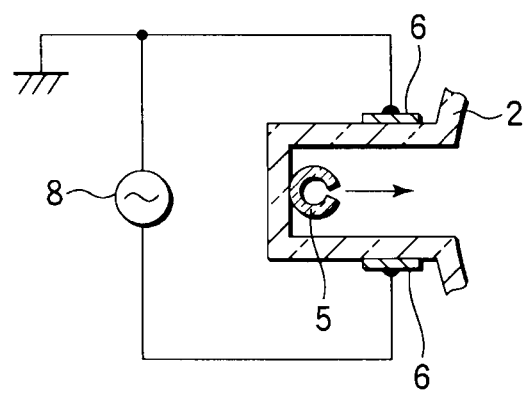
FIG. 21 is a sectional view showing part of a plasma box used in the apparatus shown in FIG. 20.

Specifically, in the case of the plasma processing apparatus of the capacitively coupled plasma type shown in FIGS. 20 and 21, the quartz inner wall of the plasma generation box 4 is etched by sputtering of ions in plasma accelerated by an electric potential difference applied to an ion sheath. Consequently, substances containing Si and O components of quartz material are deposited on the inner surface of the plasma generation box 4 and portions around the surface and may generate particles.

Further, when the inner wall is etched as described above, a metal, such as Na, slightly contained in quartz is scattered and thereby causes metal contamination. In addition, since the plasma electrodes 6 are respectively present on the opposite sidewalls of the plasma generation box 4, both of the inner surfaces of the sidewalls of the plasma generation box 4 are etched by generated plasma, and particle generation and metal contamination are increased by that much.

Further, where a larger power is applied to increase the electron density and thereby improve the process efficiency, the particle generation described above is abruptly increased due to the larger power. Accordingly, it is difficult to increase the electron density.

In this case, the applied RF power can be set to have a higher frequency to decrease the electron temperature and thereby suppress etching while increasing the radical density to promote the reaction. However, with an increase in frequency, the RF power supply needs to be larger and thereby drastically increases the apparatus cost. On the other hand, as disclosed in International Publication No. WO 2006/093136, there has been proposed a plasma processing apparatus provided with an electrical discharge electrode formed of a U-shaped coil making one turn and configured to generate inductively coupled plasma. However, the apparatus disclosed in this publication entails a difficulty in practical application.

In light of this, the development team which the present inventors belong to has developed a plasma processing apparatus including a plasma generation box provided with an ICP (Inductively Coupled Plasma) electrode (US 2009/0056877 A1). It has been found by the present inventors, however, that this plasma processing apparatus still has a room for improvement in terms of problems due to a capacitive coupling component given by the ICP electrode and problems concerning the radical generation amount.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

<First Embodiment>

Figure 1:
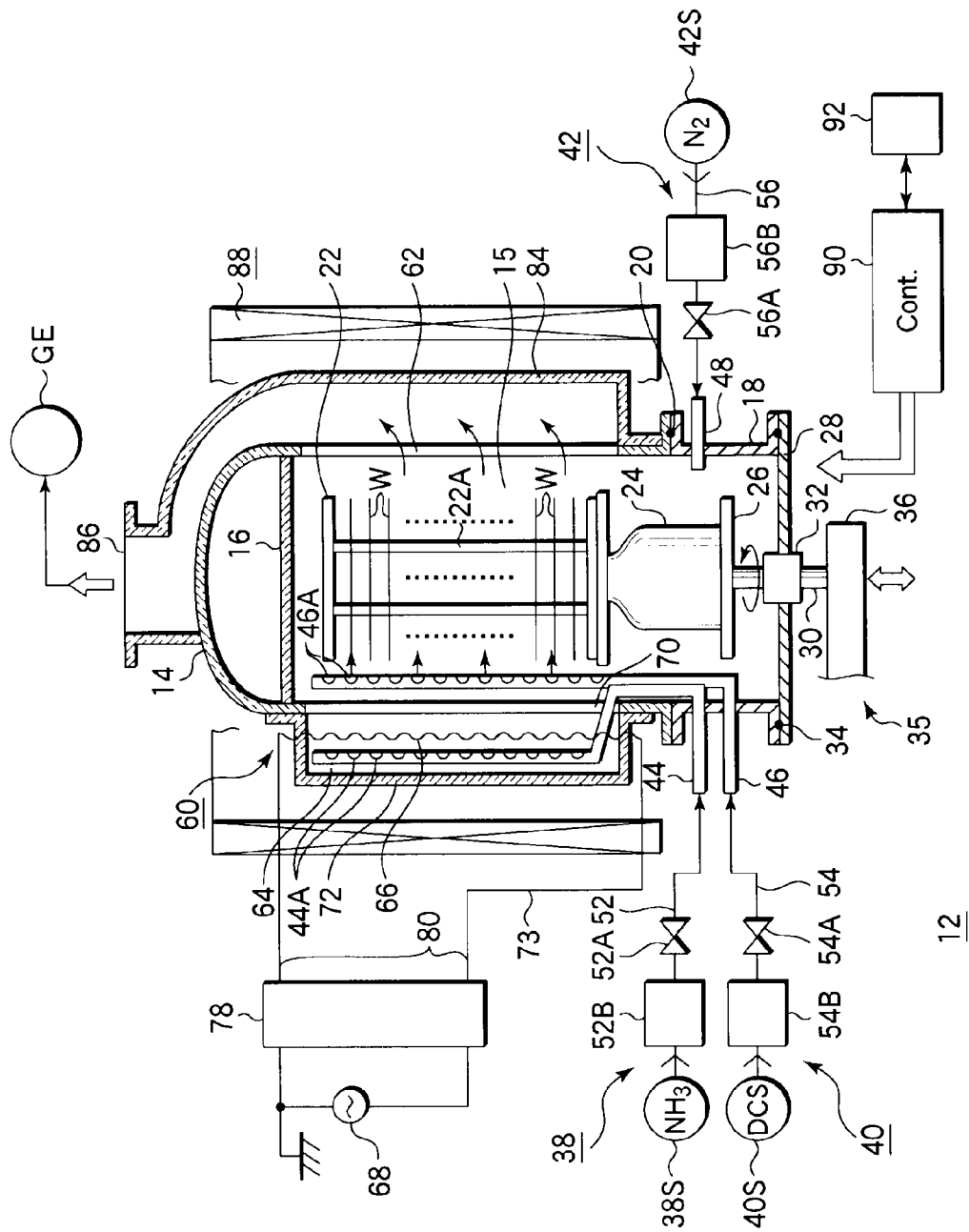
FIG. 1 is a sectional front view showing a vertical plasma processing apparatus according to a first embodiment of the present invention.
Figure 2:
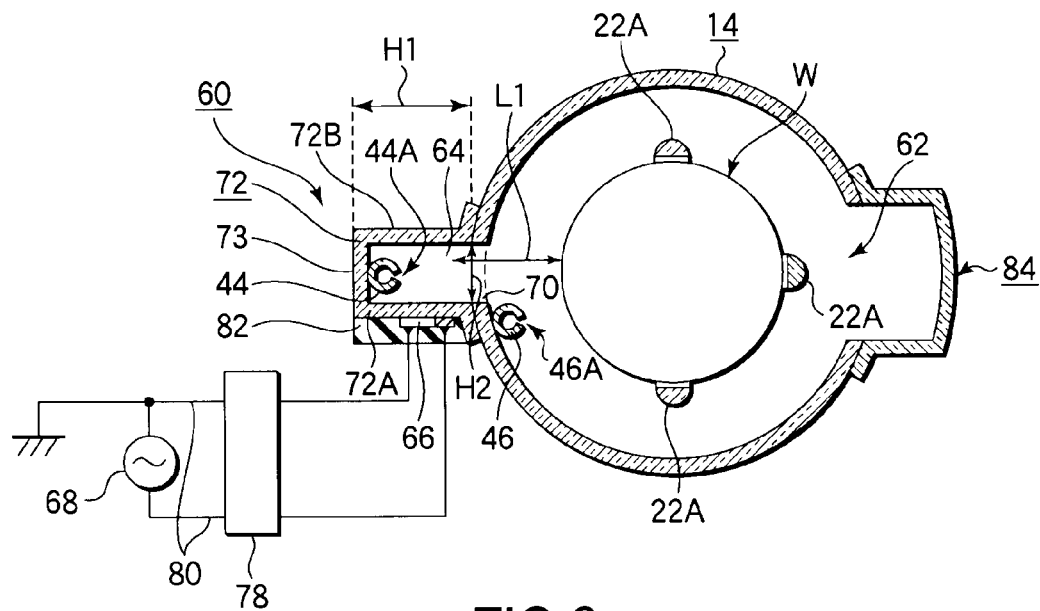
FIG. 2 is a sectional plan view showing part of the apparatus shown in FIG. 1 (excluding the heater)
Figure 3:
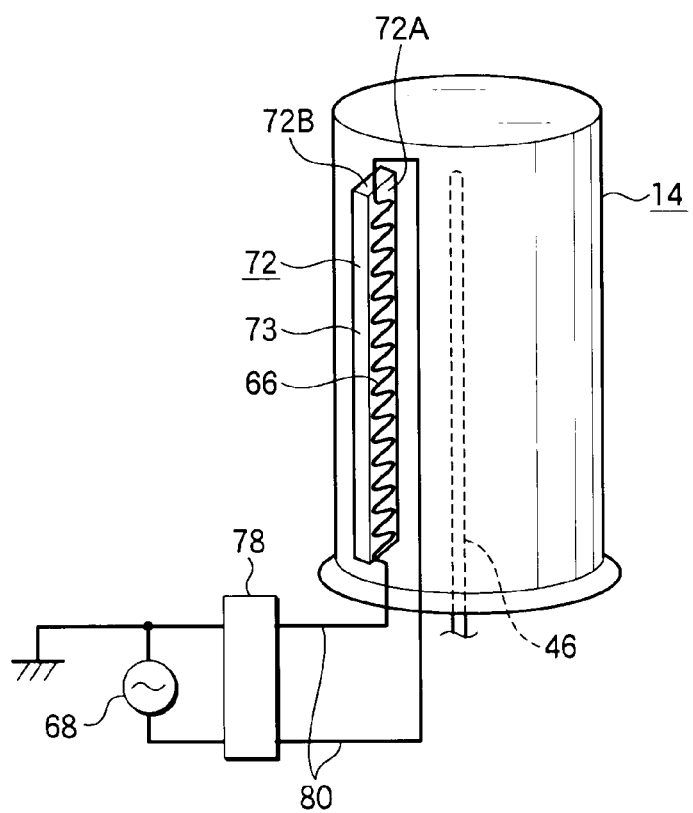
FIG. 3 is a schematic perspective view showing the process container of the apparatus shown in FIG. 1 provided with an ICP (Inductively Coupled Plasma) electrode (which means an electrode that forms an inductive electromagnetic field for generating inductively coupled plasma, hereinafter)
Figure 4A:
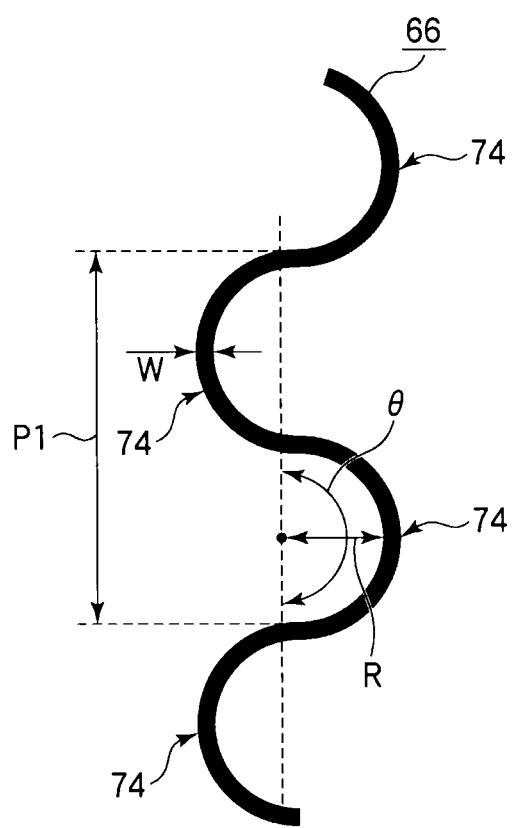
FIGS. 4A and 4B are enlarged views showing part of the ICP electrode of the apparatus shown in FIG. 1.
Figure 4B:
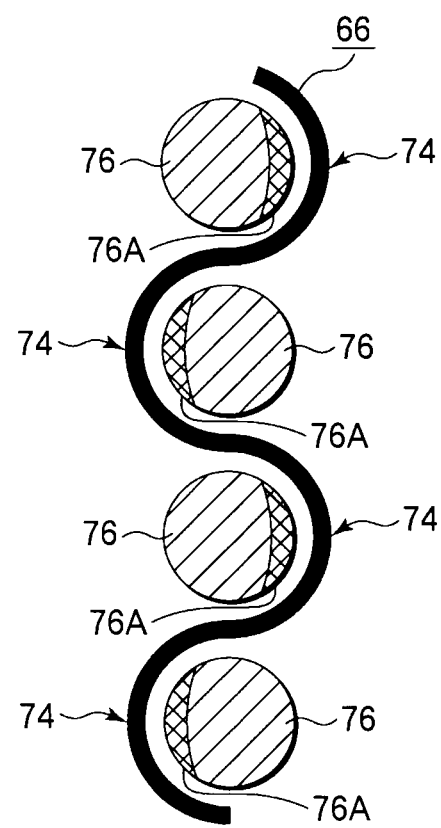

FIG. 1 is a sectional front view showing a vertical plasma processing apparatus according to a first embodiment of the present invention. FIG. 2 is a sectional plan view showing part of the apparatus shown in FIG. 1 (excluding the heater). FIG. 3 is a schematic perspective view showing the process container of the apparatus shown in FIG. 1 provided with an ICP electrode. FIGS. 4A and 4B are enlarged views showing part of the ICP electrode of the apparatus shown in FIG. 1. The film formation apparatus 12 has a process field configured to be selectively supplied with a first process gas containing dichlorosilane (DCS) gas as a silane family gas, and a second process gas containing ammonia ($NH_3$) gas as a nitriding gas. The film formation apparatus 12 is configured to form a silicon nitride film on target objects in the process field, while activating the $NH_3$ gas by use of plasma.

The apparatus 12 includes a process container 14 shaped as a cylindrical column with a ceiling and an opened bottom, in which a process field 15 is defined to accommodate and process a plurality of semiconductor wafers (target objects) stacked at intervals in the vertical direction. The entirety of the process container 14 is made of, e.g., quartz. The top of the process container 14 is provided with a quartz ceiling plate 16 to airtightly seal the top. The bottom of the process container 14 is connected through a seal member 20, such as an O-ring, to a cylindrical manifold 18 made of, e.g., stainless steel. The process container may be entirely formed of a cylindrical quartz column with a portion corresponding to the manifold 18 and also made of quartz.

The manifold 18 supports the bottom of the process container 14. A wafer boat 22 made of quartz is moved up and down through the bottom port of the manifold 18, so that the wafer boat 22 is loaded/unloaded into and from the process container 14. A number of target objects or semiconductor wafers W are stacked on the wafer boat 22 at intervals in the vertical direction.

For example, in this embodiment, the wafer boat 22 has struts 22A that can support, e.g., about 50 to 150 wafers having a diameter of 300 mm at essentially regular intervals in the vertical direction.

The wafer boat 22 is placed on a table 26 through a heat-insulating cylinder 24 made of quartz. The table 26 is supported by a rotary shaft 30, which penetrates a lid 28 made of, e.g., stainless steel and used for opening/closing the bottom port of the manifold 18. The portion of the lid 28 where the rotary shaft 30 penetrates is provided with, e.g., a magnetic-fluid seal 32, so that the rotary shaft 30 is rotatably supported in an airtightly sealed state. A seal member 34, such as an O-ring, is interposed between the periphery of the lid 28 and the bottom of the manifold 18, so that the interior of the process container 14 can be kept sealed.

The rotary shaft 30 is attached at the distal end of an arm 36 supported by an elevating mechanism 35, such as a boat elevator. The elevating mechanism 35 moves the wafer boat 22 and lid 28 up and down integratedly. The table 26 may be fixed to the lid 28, so that wafers W are processed without rotation of the wafer boat 22.

A gas supply section is connected to the side of the manifold 18 to supply predetermined process gases to the process field 15 within the process container 14. Specifically, the gas supply section includes a second process gas supply circuit 38, a first process gas supply circuit 40, and a purge gas supply circuit 42. The first process gas supply circuit 40 is arranged to supply a first process gas containing a silane family gas, such as DCS (dichlorosilane) gas. The second process gas supply circuit 38 is arranged to supply a second process gas containing a nitriding gas, such as ammonia ($NH_3$) gas. The purge gas supply circuit 42 is arranged to supply an inactive gas, such as $N_2$ gas, as a purge gas. Each of the first and second process gases is mixed with a suitable amount of carrier gas, as needed. However, such a carrier gas will not be mentioned, hereinafter, for the sake of simplicity of explanation.

More specifically, the second and first process gas supply circuits 38 and 40 include gas distribution nozzles 44 and 46, respectively, each of which is formed of a quartz pipe which penetrates the sidewall of the manifold 18 from the outside and then turns and extends upward (see FIG. 1). The gas distribution nozzles 44 and 46 respectively have a plurality of gas spouting holes 44A and 46A, each set of holes being formed at predetermined intervals in the longitudinal direction (the vertical direction) over all the wafers W on the wafer boat 22. Each of the gas spouting holes 44A and 46A delivers the corresponding process gas almost uniformly in the horizontal direction, so as to form gas flows parallel with the wafers W on the wafer boat 22. The purge gas supply circuit 42 includes a short gas nozzle 48, which penetrates the sidewall of the manifold 18 from the outside.

The nozzles 44, 46, and 48 are connected to gas sources 38S, 40S, and 42S of $NH_3$ gas, DCS gas, and $N_2$ gas, respectively, through gas supply lines (gas passages) 52, 54, and 56, respectively. The gas supply lines 52, 54, and 56 are provided with switching valves 52A, 54A, and 56A and flow rate controllers 52B, 54B, and 56B, such as mass flow controllers, respectively. With this arrangement, $NH_3$ gas, DCS gas, and $N_2$ gas can be supplied at controlled flow rates.

A gas activation mechanism 60 is attached to the sidewall of the process container 14 in the vertical direction. The activation mechanism 60 includes a plasma generation box 64 extending in the longitudinal direction of the process container 14. An ICP electrode 66 is disposed along the plasma generation box 64 and is connected to an RF (radio frequency) power supply 68. On the side of the process container 14 opposite to the plasma generation box 64, a long narrow exhaust port 62 for vacuum-exhausting the inner atmosphere is formed by, e.g., cutting the sidewall of the process container 14 in the vertical direction.

Specifically, the plasma generation box 64 has a vertically long narrow opening 70 formed by cutting a predetermined width of the sidewall of the process container 14 in the vertical direction. The opening 70 is covered with a quartz cover 72 airtightly connected to the outer surface of the process container 14 by welding. The cover 72 has a vertical long and thin shape with a concave cross-section or U-shaped cross-section, so that it projects outward from the process container 14. Accordingly, the cover 72 comprises a pair of sidewalls 72A and 72B extending from the process container 14 in the radial direction and facing each other, and a backside wall that connects the outer ends of the sidewalls 72A and 72B to each other. The upper ends and lower ends of the sidewalls 72A and 72B are also closed by sealing walls. The thickness of the cover 72, i.e., the thickness of the sidewalls 72A and 72B and backside wall 73 is set at a value of about 4.5 to 6.5 mm, so that it withstands the pressure difference between atmospheric pressure and the vacuum pressure inside the process container.

With this arrangement, the plasma generation box 64 is formed such that it projects outward from the sidewall of the process container 14 and is opened on the other side to the interior of the process container 14. In other words, the plasma generation box 64 contains a plasma generation area and the inner space of the plasma generation box 64 communicates with the process field 15 within the process container 14. The opening 70 has a vertical length sufficient to cover all the wafers W on the wafer boat 22 in the vertical direction.

As shown in FIG. 3, the ICP electrode 66 provided to the plasma generation box 64 is formed only of one electrode disposed on the surface of one of the sidewalls 72A and 72B, e.g., the sidewall 72A in this embodiment, and extending in the longitudinal direction thereof (vertical direction). The electrode 66 is formed of a coil making a substantially half turn relative to the plasma generation box 64 such that it bent back outward at the top of the sidewall 72A to be separate from the plasma generation box 64. The electrode 66 is covered with an insulating plate 82 made of, e.g., quartz, for safety's sake.

The gas distribution nozzle 44 of the second process gas is bent outward in the radial direction of the process container 14, at a position lower than the lowermost wafer W on the wafer boat 22. Then, the gas distribution nozzle 44 vertically extends at the deepest position (the farthest position from the center of the process container 14) in the plasma generation box 64. As shown also in FIG. 2, the gas distribution nozzle 44 is separated outward from an area facing the electrode 66 (a position where the inductive electromagnetic field is most intense), i.e., a plasma generation area where the main plasma is actually generated. The second process gas containing $NH_3$ gas is spouted from the gas spouting holes 44A of the gas distribution nozzle 44 toward the plasma generation area. Then, the second process gas is selectively excited (decomposed or activated) in the plasma generation area, and is supplied in this state onto the wafers W on the wafer boat 22.

An insulating protection cover (not shown) made of, e.g., quartz is attached on and covers the outer surface of the cover 72. A cooling mechanism (not shown) is disposed inside the insulating protection cover (not shown) and comprises a coolant passage facing the electrode 66. The coolant passage is supplied with a coolant, such as cooled nitrogen gas, to cool the electrode 66.

At a position near and outside the opening 70 of the gas activation mechanism 60, the gas distribution nozzle 46 of the first process gas is disposed. Specifically, the gas distribution nozzle 46 extends upward on one side of the outside of the opening 70 (in the process container 14). The first process gas containing DCS gas is spouted from the gas spouting holes 46A of the gas distribution nozzle 46 toward the center of the process container 14.

On the other hand, the exhaust port 62, which is formed opposite the gas activation mechanism 60, is covered with an exhaust port cover 84. The exhaust port cover 84 is made of quartz with a U-shape cross-section and is attached by welding. The exhaust cover 84 extends upward along the sidewall of the process container 14 and has a gas outlet 86 at the top of the process container 14. The gas outlet 86 is connected to a vacuum-exhaust system GE including a vacuum pump and so forth.

The process container 14 is surrounded by a heater 88, which is used for heating the atmosphere within the process container 14 and the wafers W. A thermocouple (not shown) is disposed near the exhaust port 62 in the process container 14 to control the heater 88.

The film formation apparatus 12 further includes a main control section 90 formed of, e.g., a computer, to control the entire apparatus. The main control section 90 can control a film formation process in accordance with process recipes stored in a storage section 92 thereof in advance, with reference to the film thickness and composition of a film to be formed. In the storage section 92, the relationship between the process gas flow rates and the thickness and composition of the film is also stored as control data in advance. Accordingly, the main control section 90 can control the elevating mechanism 35, gas supply circuits 38, 40, and 42, exhaust system GE, gas activation mechanism 60, heater 88, and so forth, based on the stored process recipes and control data. Examples of a storage medium for this purpose are a magnetic disk (flexible disk, hard disk (a representative of which is a hard disk included in the storage section 92), etc.), an optical disk (CD, DVD, etc.), a magneto-optical disk (MO, etc.), and a semiconductor memory.

As shown in FIGS. 4A and 4B, the ICP electrode 66 provided to the plasma generation box 64 is a meandering electrode having a plurality of bent portions 74, so that the installation area and installation length of the electrode relative to the plasma generation box 64 can be set larger as far as possible. Specifically, a plurality of bent portions 74 comprise first and second bent portions bent in opposite directions, i.e., right and left, and the first and second bent portions are alternately connected to each other to form a meandering shape. Each of the bent portions 74 has an arc shape, and specifically a semicircular arc shape. In other words, the bent portions 74 each having a semicircular arc shape are connected to each other to alternately face opposite directions to form continuously connected S-shapes, thereby forming the meandering shape. The arc shape of the bent portions 74 is not limited to semicircle.

Specifically, for example, the radius R of the arc shape is set at a value within a range of 5 to 150 mm, such as about 5 to 50 mm, and the arc angle θ is set at a value within a range of π/6 to 3π/2, preferably of π/2 to 3π/2, such as θ=π to make a semicircular arc shape as in this embodiment. The width W of the electrode 66 is set at a value within a range of about 2 to 10 mm, although it depends on the width of the sidewall 72A. The pitch P1 of the meandering shape is set at a value within a range of, e.g., about 20 to 1,000 mm. The meandering width of the electrode is set such that the electrode does not reach the position corresponding to the gas distribution nozzle 44 disposed inside the plasma generation box 64, so that generated plasma cannot come into contact with the gas nozzle 44.

As shown in FIG. 4B, when an RF current flows through the electrode 66, circular regions 76 (which are shown with hatched lines) inside the arcs of the electrode 66 bring about high density plasma areas because the electric field formed by the RF power comes to have a higher intensity at the regions 76 and locally increases the plasma density. Particularly, the electric field becomes most intense at the crescent portions 76A of the circular regions 76, i.e., the deepest portions of the arcs. Since the regions 76 are distributed at predetermined intervals inside the plasma generation box 64, a larger plasma generation area is obtained as a whole, and the plasma density becomes more uniform.

The distance L1 from the electrode 66 to the nearest portion of the wafers W is set at 40 mm or more. This is conceived to prevent plasma leakage from the plasma generation box 64 from coming into direct contact with the wafers W and damaging the wafers W due to plasma.

The electrode 66 may be formed of a width plate electrode to obtain a large installation area, in place of a meandering electrode having a plurality of bent portions 74. However, in this case, since the thermal capacity of the electrode is large, the self-heating of the electrode can go beyond a negligible level with an increase in the RF current. Consequently, the temperature control of the wafers W is adversely affected, and the film formation rate may be thereby changed. In light of this, the width of the electrode is set at a value within a range of about 2 to 10 mm. The proximal end side of the ICP electrode 66 is connected to an RF power supply 68 through a matching circuit 74 for impedance matching and further through an electric feed line 80. Adjustment signals (not shown) are transmitted between the matching circuit 74 and RF power supply 68 to automatically adjust the impedance.

The ICP electrode 66 is grounded at one end, e.g., at the lower end as in this embodiment. The RF power is set to have a frequency of, e.g., 13.56 MHz, but it may be set to have another frequency within a range of 4 MHz to 27.12 MHz.

When an RF power is applied to the ICP electrode 66, plasma is generated by an electromagnetic field of the inductively coupling type formed inside the plasma generation box 64. The plasma generation box 64 is designed to have a length of about 1 m, a width H1 (see FIG. 2) of about 50 to 120 mm, such as about 55 mm, and a thickness H2 of 5 to 50 mm, and preferably of about 20 to 50 mm, such as 35 mm. The ICP electrode 66 is made of, e.g., a nickel alloy, and is designed to have a thickness of about 3 to 5 mm, and a width of about 2 to 10 mm.

Next, an explanation will be given of a film formation method (so called ALD or MLD film formation) performed in the apparatus shown in FIG. 1. In this film formation method, a silicon nitride film is formed on semiconductor wafers by ALD or MLD. In order to achieve this, a first process gas containing dichlorosilane (DCS) gas as a silane family gas and a second process gas containing ammonia ($NH_3$) gas as a nitriding gas are selectively supplied into the process field 15 accommodating wafers W. Specifically, a film formation process is performed along with the following operations.

At first, the wafer boat 22 at room temperature, which supports a number of, e.g., 50 to 150, wafers having a diameter of 300 mm, is loaded into the process container 14 heated at a predetermined temperature, and the process container 14 is airtightly closed. Then, the interior of the process container 14 is vacuum-exhausted and kept at a predetermined process pressure, and the wafer temperature is increased to a process temperature for film formation. At this time, the apparatus is in a waiting state until the temperature becomes stable. Then, while the wafer boat 22 is rotated, the first and second process gases are intermittently supplied from the respective gas distribution nozzles 46 and 44 at controlled flow rates. A cycle of alternately supplying the first and second process gases with a gap period (purge period) interposed therebetween is repeated a number of times, and thin films of silicon nitride formed by respective cycles are laminated, thereby arriving at a silicon nitride film having a target thickness.

Specifically, the first process gas containing DCS gas is supplied from the gas spouting holes 46A of the gas distribution nozzle 46 to form gas flows parallel with the wafers W on the wafer boat 22. While being supplied, the DCS gas is activated by the heating temperature to the process field 15, and molecules of the DCS gas and molecules and atoms of decomposition products generated by decomposition thereof are adsorbed on the wafers W.

On the other hand, the second process gas containing $NH_3$ gas is supplied from the gas spouting holes 44A of the gas distribution nozzle 44 to form gas flows parallel with the wafers W on the wafer boat 22. When the second process gas is supplied, the RF power supply 68 of the gas activation mechanism 60 is set in the ON-state over a period of the entirety or part of the supply. At this time, the output of the RF power 68 is set to be within a range of, e.g., 50 W to 3 kW.

When the gas activation mechanism 60 is set in the ON-state, the second process gas is excited and partly turned into plasma when it passes through the plasma generation area facing the ICP electrode 66. At this time, for example, radicals (activated species), such as N*, NH*, $NH_2$*, and $NH_3$*, are produced (the symbol "*" denotes that it is a radical). The radicals flow out from the opening 70 of the gas activation mechanism 60 toward the center of the process container 14, and are supplied into gaps between the wafers W in a laminar flow state.

The radicals react with molecules and so forth derived from the DCS gas and adsorbed on the surface of the wafers W, so that a thin film of silicon nitride is formed on the wafers W. Alternatively, when DCS gas flows onto radicals derived from $NH_3$ gas and adsorbed on the surface of the wafers W, the same reaction is caused, so a thin film of silicon nitride is formed on the wafers W.

The plasma generation box 64 is provided with the ICP electrode 66 having a meandering shape, in place of CCP electrodes of the parallel-plate type used in conventional apparatuses, to generate plasma in the plasma generation area. In this case, plasma is generated by an electromagnetic field formed by the electrode 66, while the ion sheath has a smaller electric potential difference. Consequently, ions in the plasma are accelerated at a lower degree, and so the inner surface of the cover 72 is prevented from being etched by sputtering of ions. This makes it possible to significantly decrease particle generation that may deteriorate the yield of semiconductor devices.

Since the electrode 66 is disposed on only one of the sidewalls 72A and 72B, the area to be sputtered by ions in plasma is smaller by that much, and so particles generated by etching is decreased to a great extent. In addition, since the inner wall of the cover 72 is etched at a smaller area, metal contamination due to, e.g., Na is decreased.

Further, since the ICP electrode 66 is used, the radical density can be increased without raising the RF power and/or frequency, and so the plasma process can be efficiency performed. In other words, a larger power can be applied while the particle generation is suppressed and the electron density is increased, thereby making the plasma process more efficient.

Furthermore, since the electrode 66 has a meandering shape, the electric field is intense at the circular regions 76, and particularly at the crescent portions 76A, as shown in FIG. 4B. Consequently, the plasma density is increased at these regions, and the radical generation amount is also increased by an enlarged installation area of the electrode. Consequently, the plasma process efficiency is increased, and the throughput is thereby improved.

A film formation process was performed and particle generation and metal contamination were measured in a plasma processing apparatus according to a present example of the first embodiment and a plasma processing apparatus according to a comparative example made in accordance with a conventional technique. As the plasma processing apparatus according to the present example, the plasma processing apparatus explained with reference to FIGS. 1 to 4B was used. As the plasma processing apparatus according to the comparative example, the plasma processing apparatus having electrodes of the capacitively coupling type shown in FIGS. 20 and 21 was used. The present example and comparative example were performed under the same process conditions. In the present example, the arc angle θ of the electrode 66 was set at 180° (θ=π).

As a result of this experiment, the plasma processing apparatus according to the comparative example rendered a sudden increase in the number of particles observed on semiconductor wafers W at a cumulative film thickness of about 0.5 to 1.0 μm, which required the process container to be cleaned. On the other hand, the plasma processing apparatus according to the present example rendered a small increase in the number of particles even at cumulative film thickness of larger than 1.0 μm, which was a preferable result.

As regards metal contamination on the semiconductor wafers, particularly sodium (Na) contamination, the plasma processing apparatus according to the comparative example rendered a value of about $1 \times 10^{10}$ atoms/cm$^2$. On the other hand, the plasma processing apparatus according to the present example rendered a value of about $0.8 \times 10^{10}$ atoms/cm$^2$ or less, which was a preferable result.

The arc angle θ of the arc bent portions 74 of the electrode 66 is set at a value within a range of about π/6 to 3π/2, as described above. If this angle θ is smaller than π/6, the advantage of the meandering shape of the electrode 66 is deteriorated to a great extent. If this angle θ is larger than 3π/2, the meandering shape becomes too large with excessive bending. In this case, for example, bent portions 74 adjacent to each other in the vertical direction may come into contact with other and bring about a short circuit, although it depends on the width of the electrode 66.

Figure 5A:
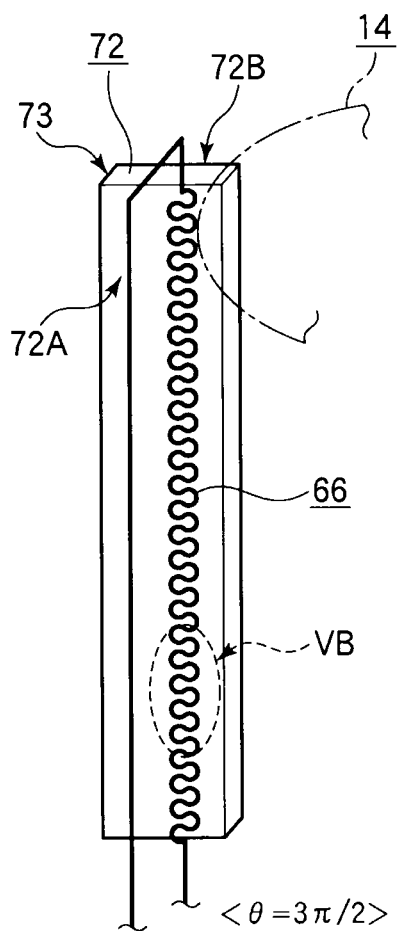
FIG. 5A is a schematic perspective view showing a state where the plasma generation box of the apparatus shown in FIG. 1 is provided with an electrode with bent portions having an arc angle θ of 3π/2.
Figure 5B:
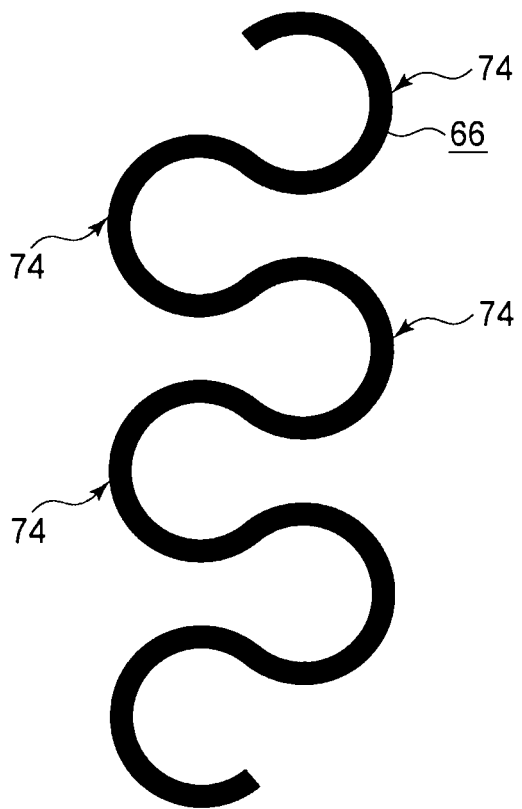
FIG. 5B is an enlarged view of a portion VB in FIG. 5A.

FIG. 5A is a schematic perspective view showing a state where the plasma generation box 64 is provided with an electrode with bent portions having an arc angle θ of 3π/2. FIG. 5B is an enlarged view of a portion VB in FIG. 5A. As shown in FIGS. 5A and 5B, θ=3π/2 is almost a limit that allows the electrode 66 to have a meandering shape. If the value of θ is larger than this value, bent portions 74 adjacent to each other in the vertical direction may come into contact with other and bring about a short circuit.

As described above, according to the first embodiment, the meandering ICP electrode 66 is disposed on the cover 72 defining the plasma generation box 64, and extends in the longitudinal direction thereof. This arrangement allows the inner wall of the cover 72 defining the plasma generation box 64 to be less etched, thereby decreasing particle generation and metal contamination. Further, the radical generation amount is increased by an enlarged electrode area. The electrode 66 may be provided to the other sidewall 72B in place of the sidewall 72A.

<Second to Sixth Embodiment>

FIGS. 6A to 6E are enlarged plan views each showing a meandering electrode used in a plasma processing apparatus, according to second to sixth embodiments of the present invention, respectively. In the first embodiment, the meandering electrode 66 has the bent portions 74 each having an arc shape. Alternatively, meandering electrodes 66 shown in FIGS. 6A to 6E may be used.

Figure 6A:
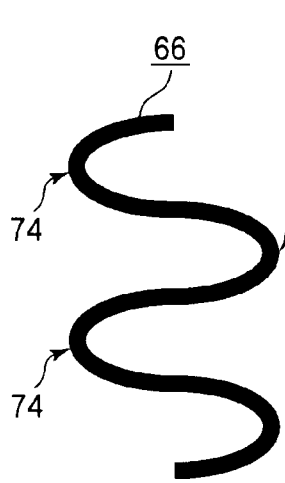
FIGS. 6A to 6E are enlarged plan views each showing a meandering electrode used in a plasma processing apparatus, according to second to sixth embodiments of the present invention, respectively.

In the second embodiment shown in FIG. 6A, the electrode 66 comprises bent portions 74 each having an elliptic arc shape, and the bent portions 74 are connected to each other to alternately face opposite directions to form a meandering shape as a whole. The meandering shape of the electrode 66 is not limited to a specific one, and it may be formed by use of, e.g., a cycloid curve or sine curve.

Figure 6B:
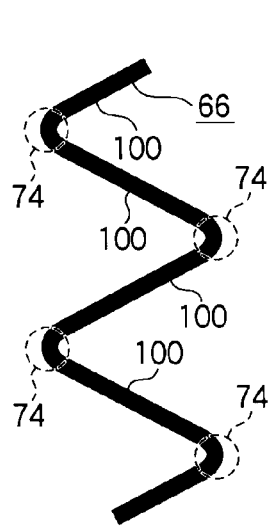

In the third embodiment shown in FIG. 6B, the meandering electrode 66 is formed of bent portions 74 and straight line portions 100 each having a predetermined length. The bent portions 74 and straight line portions 100 are alternately connected to each other to form a zigzag shape or a switchback shape. In this case, each of the bent portions 74 has a very small arc shape, for example.

Figure 6C:
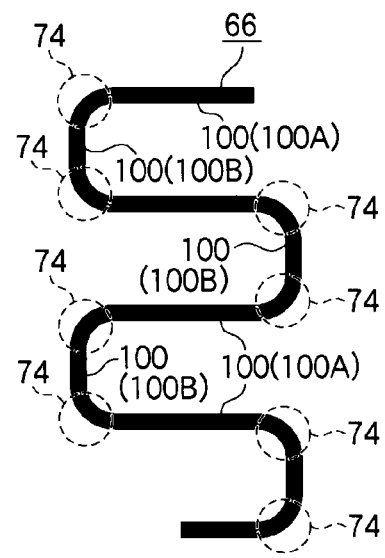

In the fourth embodiment shown in FIG. 6C, the meandering electrode 66 is formed of bent portions 74 and straight line portions 100 each having a predetermined length, as in FIG. 6B. The bent portions 74 and straight line portions 100 are alternately connected to each other to form a crank shape. In this case, each of the bent portions 74 has a very small arc shape, for example. The straight line portions 100 comprise longer straight line portions 100A and shorter straight line portions 100B alternately used. All the straight line portions 100 used in this embodiment may be straight line portions having the same length.

Figure 6D:
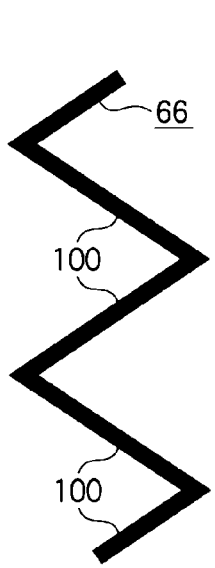

The fifth embodiment shown in FIG. 6D is similar to the third embodiment shown in FIG. 6B. In the fifth embodiment, the meandering electrode 66 is formed entirely of straight line portions 100 having the predetermined same length. The straight line portions 100 are connected to each other while they are inclined alternately in the opposite directions at predetermined angles to form a zigzag shape or a switchback shape.

Figure 6E:
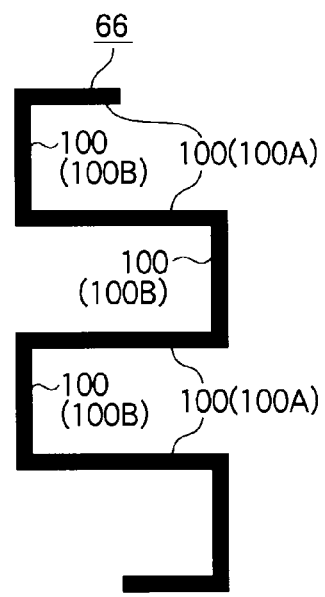

The sixth embodiment shown in FIG. 6E is similar to the fourth embodiment shown in FIG. 6C. In the sixth embodiment, the meandering electrode 66 is formed entirely of straight line portions 100 comprising longer straight line portions 100A and shorter straight line portions 100B. The straight line portions 100A and 100B of these different two types are alternately connected to each other at right angles to form a crank shape. All the straight line portions 100 used in this embodiment may be straight line portions having the same length.

The second to sixth embodiments can exhibit the same function and effect as the first embodiment described with reference to FIGS. 4A and 4B. In the first to sixth embodiments, a meandering shape formed of bent portions 74 and/or straight line portions 100 may be designed to have a smaller pitch, such as that of a sine curve.

<Seventh Embodiment>

Figure 7:
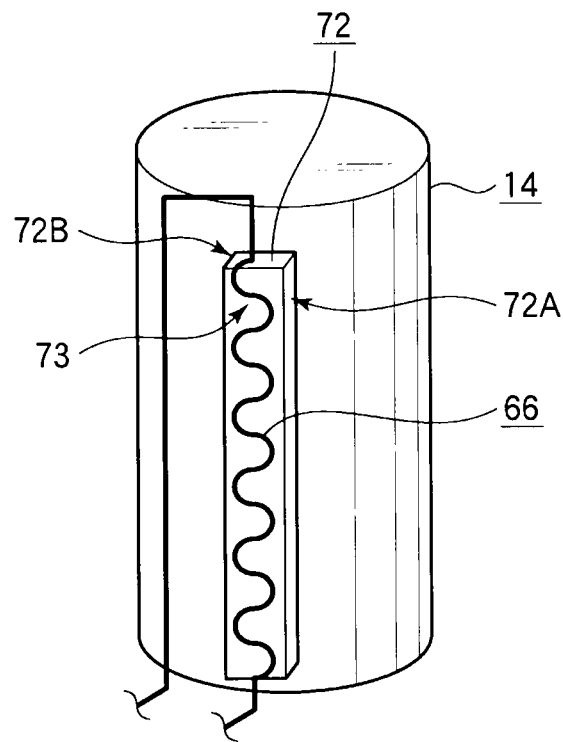
FIG. 7 is a schematic perspective view showing a main portion of a plasma processing apparatus according to a seventh embodiment of the present invention.

FIG. 7 is a schematic perspective view showing a main portion of a plasma processing apparatus according to a seventh embodiment of the present invention. In the first to sixth embodiments described above, the electrode 66 is disposed outside one of the sidewalls 72A and 72B. On the other hand, in the seventh embodiment shown in FIG. 7, the electrode 66 is disposed outside the backside wall 73.

All the other portions of this embodiment may be designed as described in the first embodiment. The electrode 66 of this embodiment may be one of those described with reference to the first to sixth embodiments. This embodiment can also exhibit the same function and effect as the first embodiment.

<Eighth Embodiment>

Figure 8:
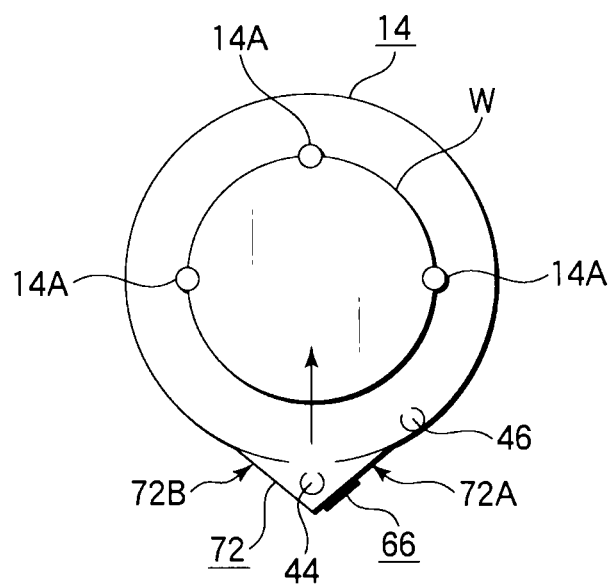
FIG. 8 is a schematic sectional view showing a main portion of a plasma processing apparatus according to an eighth embodiment of the present invention.

FIG. 8 is a schematic sectional view showing a main portion of a plasma processing apparatus according to an eighth embodiment of the present invention. In the first to seventh embodiments described above, the cover 72 has a rectangular cross section. On the other hand, in the eighth embodiment shown in FIG. 8, the cover 72 has a V-shape cross section formed by a pair of sidewalls 72A and 72B directly connected to each other at their ends. The electrode 66 is disposed outside one of the sidewalls 72A and 72B.

All the other portions of this embodiment may be designed as described in the first embodiment. The electrode 66 of this embodiment may be one of those described with reference to the first to sixth embodiments. This embodiment can also exhibit the same function and effect as the first embodiment.

<Ninth Embodiment>

Figure 9A:
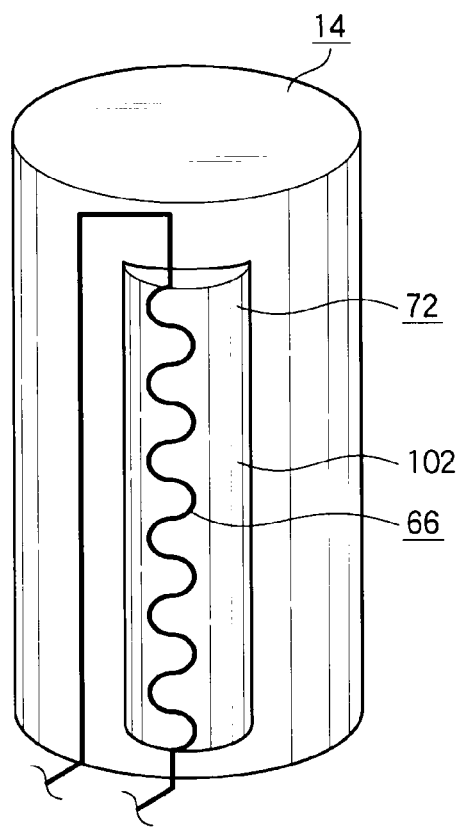
FIG. 9A is a schematic perspective view showing a main portion of a plasma processing apparatus according to a ninth embodiment of the present invention.
Figure 9B:
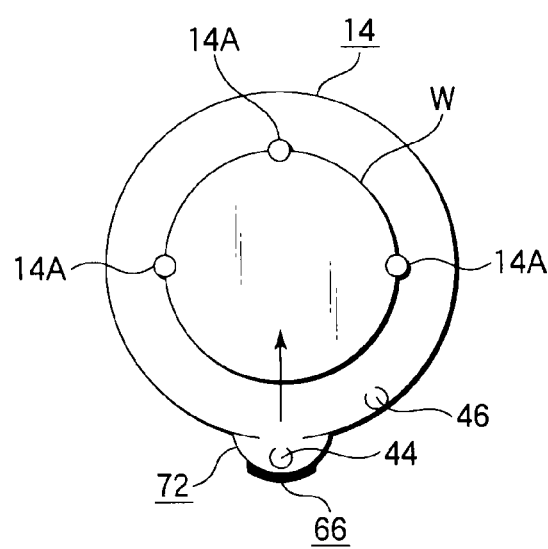
FIG. 9B is a sectional side view of the apparatus shown in FIG. 9A.

FIG. 9A is a schematic perspective view showing a main portion of a plasma processing apparatus according to a ninth embodiment of the present invention. FIG. 9B is a sectional side view of the apparatus shown in FIG. 9A. In the first to seventh embodiments described above, the cover 72 is formed of sidewalls having a straight line cross section. On the other hand, in the ninth embodiment shown in FIGS. 9A and 9B, the cover 72 is formed of a sidewall having a curved cross section. The electrode 66 is disposed outside the sidewall 102 along this sidewall. In this embodiment, the cross section of the sidewall 102 of the cover 72 may have any curved shape, such as an arc shape or elliptic arc shape.

All the other portions of this embodiment may be designed as described in the first embodiment. The electrode 66 of this embodiment may be one of those described with reference to the first to sixth embodiments. This embodiment can also exhibit the same function and effect as the first embodiment.

<Tenth Embodiment>

Figure 10A:
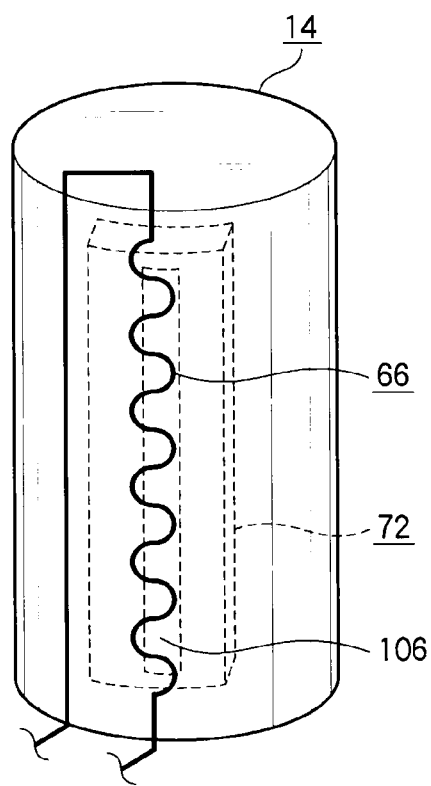
FIG. 10A is a schematic perspective view showing a main portion of a plasma processing apparatus according to a tenth embodiment of the present invention.
Figure 10B:
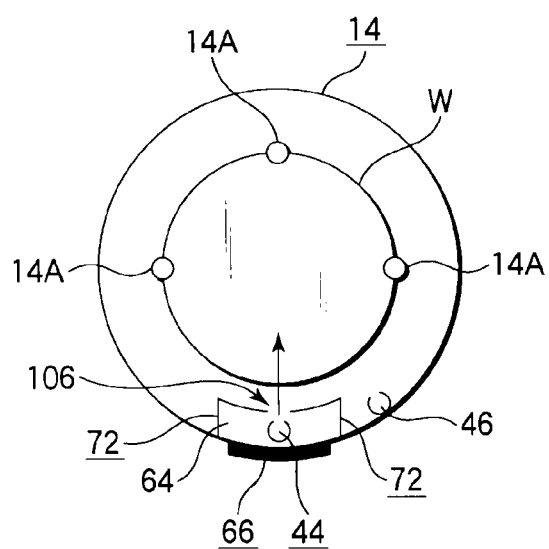
FIG. 10B is a sectional side view of the apparatus shown in FIG. 10A.

FIG. 10A is a schematic perspective view showing a main portion of a plasma processing apparatus according to a tenth embodiment of the present invention. FIG. 10B is a sectional side view of the apparatus shown in FIG. 10A. In the first to eighth embodiments described above, the cover 72 is disposed to project outside from the wall of the process container 14, and the plasma generation box 64 is defined outside the process container 14. On the other hand, in the tenth embodiment shown in FIG. 10A and FIG. 10B, a cover 72 is disposed to project inside from the wall of the process container 14, and extends in the longitudinal direction of the process container 14, and the plasma generation box 64 is defined inside the process container 14.

A meandering ICP electrode 66 is disposed outside the wall portion of the process container 14, which defines the plasma generation box 64, and extends in the longitudinal direction of the plasma generation box 64. For example, a slit-like opening 106 extending in the vertical direction is formed at the center of the cover 72, so that radicals generated inside the plasma generation box 64 is supplied to the semiconductor wafers W inside the process field 15. In this case, part of the sidewall of the process container 14 serves to partly define the plasma generation box 64.

All the other portions of this embodiment may be designed as described in the first embodiment. The electrode 66 of this embodiment may be one of those described with reference to the first to sixth embodiments. This embodiment can also exhibit the same function and effect as the first embodiment. It should be noted that the exhaust port 62 formed in the process container 14 and the exhaust port cover 84 used in the seventh to tenth embodiments are the same as those of the first embodiment and thus are not shown in some drawings.

<Eleventh Embodiment>

Figures 11A, 11B:
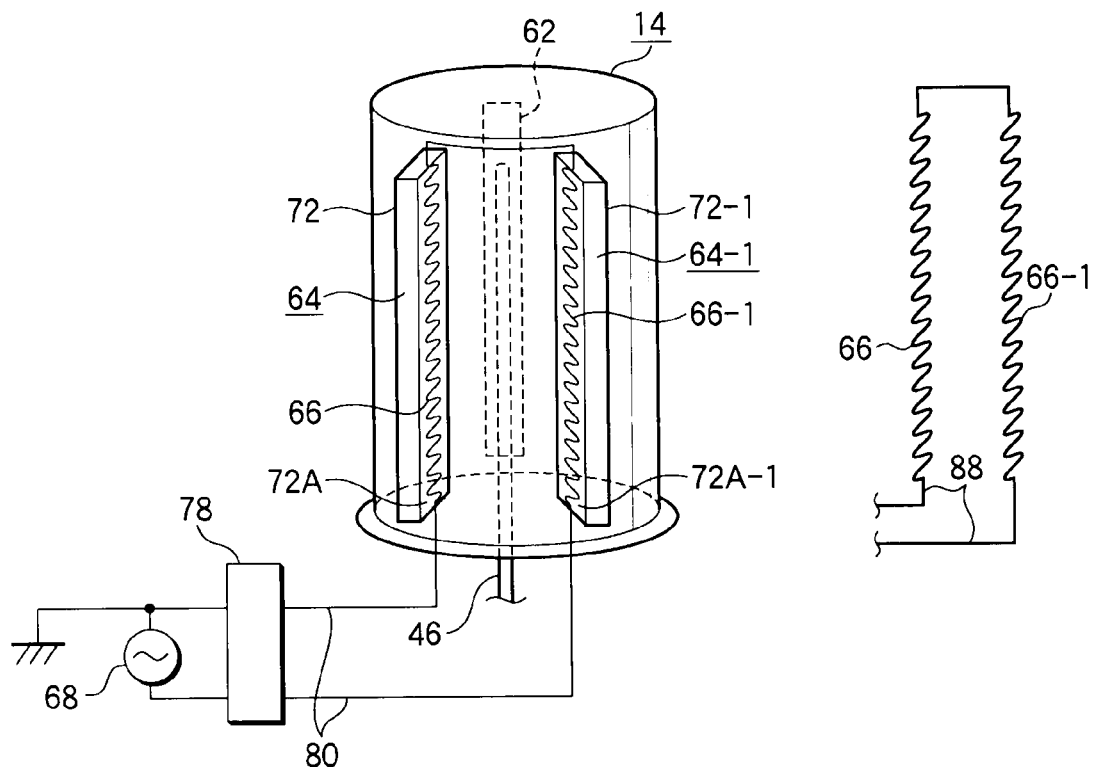
FIG. 11A is a schematic perspective view showing a main portion of a plasma processing apparatus according to an eleventh embodiment of the present invention.
FIG. 11B is a view showing the electrode of the apparatus shown in FIG. 11A.
Figure 12:
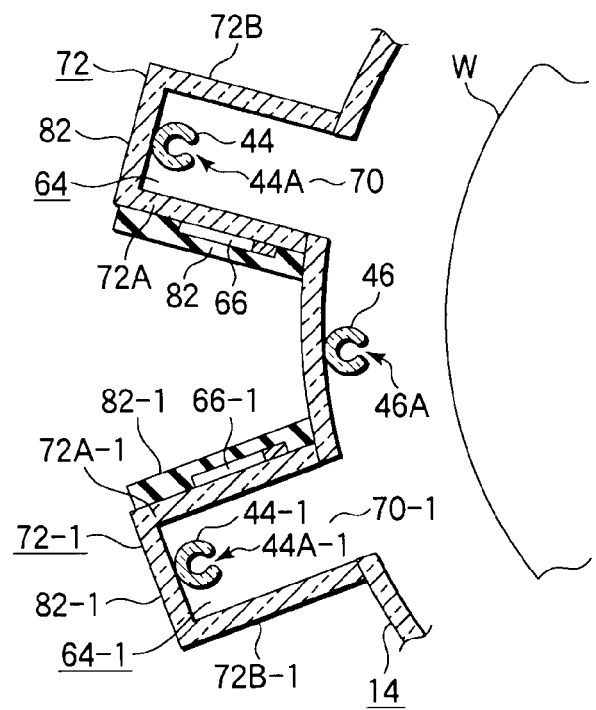
FIG. 12 is an enlarged sectional view showing part of the plasma generation box of the apparatus shown in FIG. 11A.

FIG. 11A is a schematic perspective view showing a main portion of a plasma processing apparatus according to an eleventh embodiment of the present invention. FIG. 11B is a view showing the electrode of the apparatus shown in FIG. 11A. FIG. 12 is an enlarged sectional view showing part of the plasma generation box of the apparatus shown in FIG. 11A. In the first to tenth embodiments described above, the gas activation mechanism 60 has only one plasma generation box 64. On the other hand, in the eleventh embodiment shown in FIG. 11A to FIG. 12, the activation mechanism 60 has a plurality of, such as two, plasma generation boxes to increase the radical generation amount. Specifically, the sidewall of the process container 14 is provided with a first plasma generation box 64 structured as described in the first embodiment and a second plasma generation box 64-1 disposed adjacent to the first one and extending in parallel with the first one in the vertical direction.

For example, where the process container 14 is designed to accommodate wafers W having a diameter of 300 mm, the diameter of process container 14 is set at a value within a range of about 345 to 390 mm. In this case, the distance between the two plasma generation boxes 64 and 64-1 is set at a value within a range of about 180 to 300 mm, for example. The second plasma generation box 64-1 is defined by a cover 72-1 formed of sidewalls 72A-1 and 72B-1 and a backside wall 82-1, which are the same as the sidewalls 72A and 72B and backside wall 82 of the cover 72. The upper ends and lower ends of the sidewalls 72A-1 and 72B-1 are also closed by sealing walls.

The gas distribution nozzle 46 for the first process gas is disposed inside the process container 14 at the middle position between the plasma generation boxes 64 and 64-1. In other words, the two plasma generation boxes 64 and 64-1 are disposed equidistant from the gas distribution nozzle 46, one on either side of the gas distribution nozzle 46. Accordingly, the openings 70 and 70-1 of the respective plasma generation boxes 64 and 64-1 are symmetrically present with respect to the gas distribution nozzle 46 as the center. The exhaust port 62 (see FIG. 1) is positioned opposite to the gas distribution nozzle 46 with the container central axis interposed therebetween.

The second plasma generation box 64-1 is provided with a gas distribution nozzle 44-1 disposed therein and having the same structure as the gas distribution nozzle 44 disposed in the plasma generation box 64. The second process gas containing $NH_3$ gas is spouted from the gas spouting holes 44A-1 of the gas distribution nozzle 44-1 at a controlled flow rate, as in the gas distribution nozzle 44. The second gas distribution nozzle 44-1 may be branched from the first gas distribution nozzle 44 or may be disposed independently of the first gas distribution nozzle 44.

The plasma generation boxes 64 and 64-1 are respectively provided with ICP electrodes 66 and 66-1 for radical generation. The electrodes 66 and 66-1 are respectively disposed on the sidewalls 72A and 72A-1 of the plasma generation boxes 64 and 64-1, which face each other, and extend in the longitudinal direction thereof. The second electrode 66-1 has a meandering shape as in the first electrode 66 and is covered with an insulating plate 82-1 having the same structure as the insulating plate 82.

The two electrodes 66 and 66-1 are electrically connected to each other in series over the plasma generation boxes 64 and 64-1. In other words, this circuit is equivalent to such an arrangement that the second electrode 66-1 is added to the electric feed line 80 of the circuit including the RF power supply 68 shown in FIG. 2. With this arrangement, an RF power is applied from one RF power supply 68 to the two electrodes 66 and 66-1 connected in series.

The second electrode 66-1 may be disposed on the sidewall 72B-1. The meandering shape of the electrode 66-1 may be one of those described with reference to FIGS. 5A to 6E.

According to the eleventh embodiment, the two plasma generation boxes 64 and 64-1 serve to generate radicals (activated species) derived from ammonia gas by use of the activating function described with reference to the first embodiment. Since radicals derived from ammonia gas are generated from two portions, the radical generation amount for the entire process container 14 is increased by that much and so the radical density is higher. Consequently, the reaction is promoted to increase the film formation rate and improve the throughput.

Where an RF power applied to one electrode is the same as that of the first embodiment, this eleventh embodiment is arranged to apply a double RF power. However, the plasma density inside each of the plasma generation boxes 64 and 64-1 is the same as that of the first embodiment. Accordingly, as in the first embodiment, the inner surface of the covers 72 and 72-1 are less sputtered, and particle generation is decreased.

All the other portions of this embodiment may be designed as described in the first embodiment. The electrodes 66 and 66-1 of this embodiment may be one of those described with reference to the first to sixth embodiments. This embodiment can also exhibit the same function and effect as the first embodiment. In this embodiment, the two plasma generation boxes 64 and 64-1 are used, but the number of plasma generation boxes may be three or more. This matter is common to the other embodiments described below.

<Twelfth Embodiment>

Figure 13:
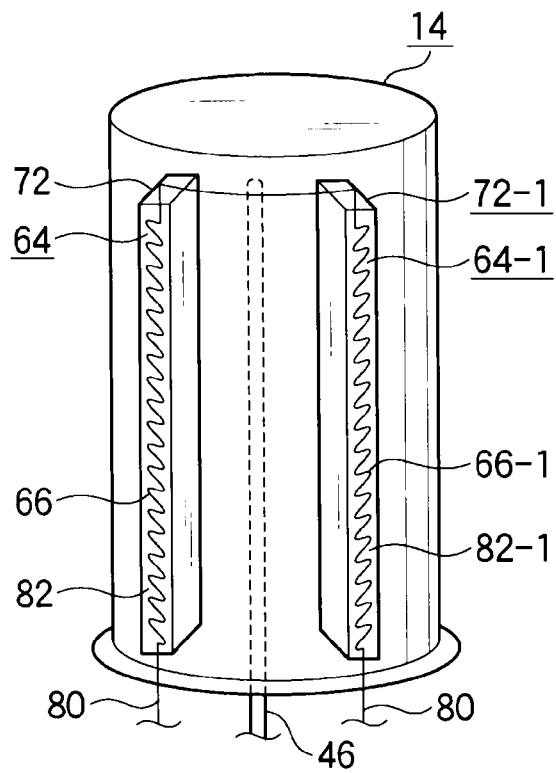
FIG. 13 is a schematic perspective view showing a main portion of a plasma processing apparatus according to a twelfth embodiment of the present invention.

FIG. 13 is a schematic perspective view showing a main portion of a plasma processing apparatus according to a twelfth embodiment of the present invention. In the eleventh embodiment described above, each of the electrodes 66 and 66-1 is disposed outside one of the sidewalls of the plasma generation boxes 64 and 64-1. On the other hand, in the twelfth embodiment shown in FIG. 13, each of the electrodes 66 and 66-1 is disposed outside the backside wall.

This twelfth embodiment is similar to the seventh embodiment show in FIG. 7. As shown in FIG. 13, the two electrodes 66 and 66-1 connected in series are respectively disposed outside the backside walls 82 and 82-1 of the covers 72 and 72-1 defining the plasma generation boxes 64 and 64-1, and extend in the longitudinal direction thereof.

All the other portions of this embodiment may be designed as described in the first embodiment. The electrodes 66 and 66-1 of this embodiment may be one of those described with reference to the first to sixth embodiments. This embodiment can also exhibit the same function and effect as the first and eleventh embodiments.

<Thirteenth Embodiment>

Figure 14:
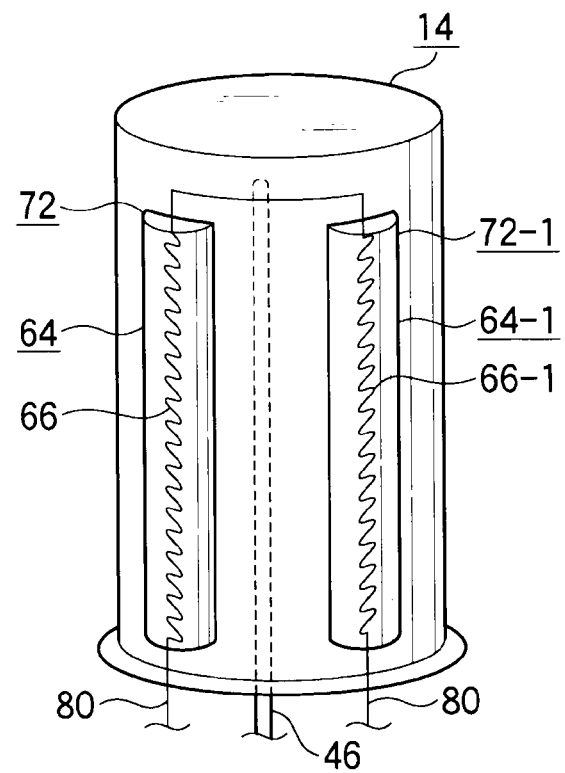
FIG. 14 is a schematic perspective view showing a main portion of a plasma processing apparatus according to a thirteenth embodiment of the present invention.

FIG. 14 is a schematic perspective view showing a main portion of a plasma processing apparatus according to a thirteenth embodiment of the present invention. In the eleventh and twelfth embodiments described above, each of the covers 72 and 72-1 defining the plasma generation boxes 64 and 64-1 is formed of sidewalls having a straight line cross section. On the other hand, in the thirteenth embodiment shown in FIG. 14, each of the covers 72 and 72-1 is formed of a sidewall having a curved cross section.

This thirteenth embodiment is similar to the ninth embodiment shown in FIGS. 9A and 9B. As shown in FIG. 14, the two electrodes 66 and 66-1 connected in series are respectively disposed outside the sidewall 102 having a curved cross section, and extend in the longitudinal direction thereof. In this embodiment, the cross section of the covers 72 and 72-1 may have any curved shape, such as an arc shape or elliptic arc shape.

All the other portions of this embodiment may be designed as described in the first embodiment. The electrodes 66 and 66-1 of this embodiment may be one of those described with reference to the first to sixth embodiments. This embodiment can also exhibit the same function and effect as the first and eleventh embodiments.

<Fourteenth Embodiment>

Figure 15:
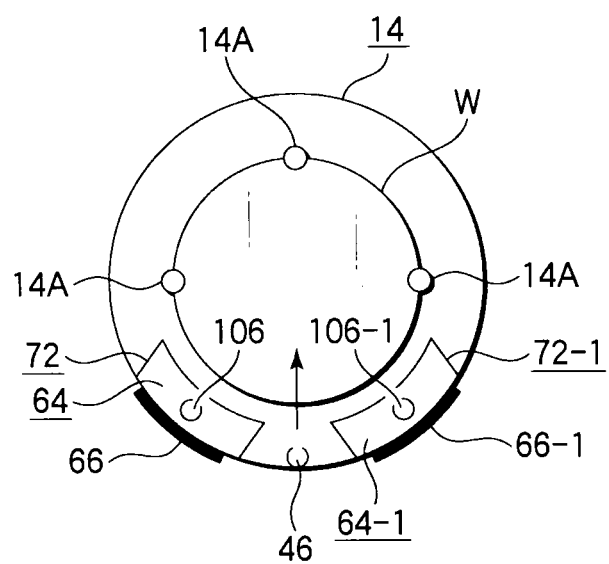
FIG. 15 is a schematic sectional view showing a main portion of a plasma processing apparatus according to a fourteenth embodiment of the present invention.

FIG. 15 is a schematic sectional view showing a main portion of a plasma processing apparatus according to a fourteenth embodiment of the present invention. In the eleventh to thirteenth embodiments described above, the covers 72 and 72-1 are disposed to project outside from the wall of the process container 14, and the plasma generation boxes 64 and 64-1 are defined outside the process container 14. On the other hand, in the fourteenth embodiment shown in FIG. 15, covers 72 and 72-1 are disposed to project inside from the wall of the process container 14, and extend in the longitudinal direction of the process container 14, and the plasma generation boxes 64 and 64-1 are defined inside the process container 14.

This fourteenth embodiment is similar to the tenth embodiment shown in FIGS. 10A and 10B. As shown in FIG. 15, the sidewall of the process container 14 is provided with two plasma generation boxes 64 and 64-1 respectively defined by covers 72 and 72-1 disposed adjacent to each other and extending in the longitudinal direction of the process container 14. The two electrodes 66 and 66-1 connected in series are respectively disposed outside the wall portions of the process container 14, which respectively define the plasma generation boxes 64 and 64-1, and extend in the longitudinal directions of the plasma generation boxes 64 and 64-1. Slit-like openings 106 and 106-1 extending in the vertical direction are respectively formed at the center of the covers 72 and 72-1.

All the other portions of this embodiment may be designed as described in the first embodiment. The electrodes 66 and 66-1 of this embodiment may be one of those described with reference to the first to sixth embodiments. This embodiment can also exhibit the same function and effect as the first, eleventh, and ninth embodiments.

It should be noted that, the insulating plates 82 and 82-1 covering the electrodes 66 and 66-1 are not explained in the seventh to tenth embodiments and twelfth to fourteenth embodiments. However, as a matter of course, such an insulating plate is disposed in these embodiments.

<Fifteenth Embodiment>

Figure 16:
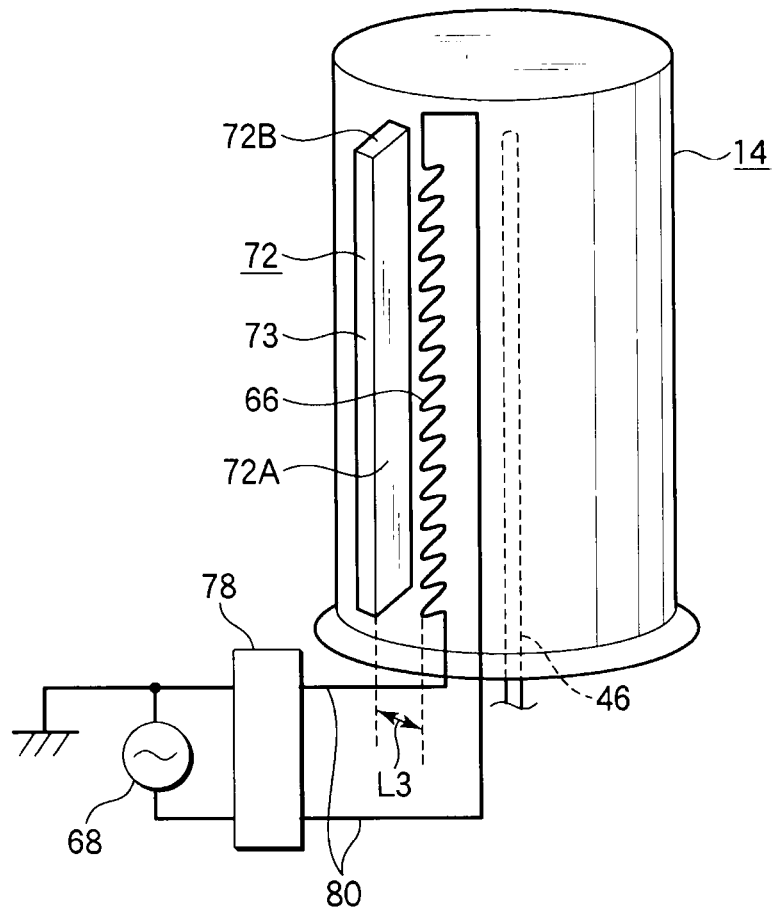
FIG. 16 is a schematic perspective view showing a main portion of a plasma processing apparatus according to a fifteenth embodiment of the present invention.
Figure 17:
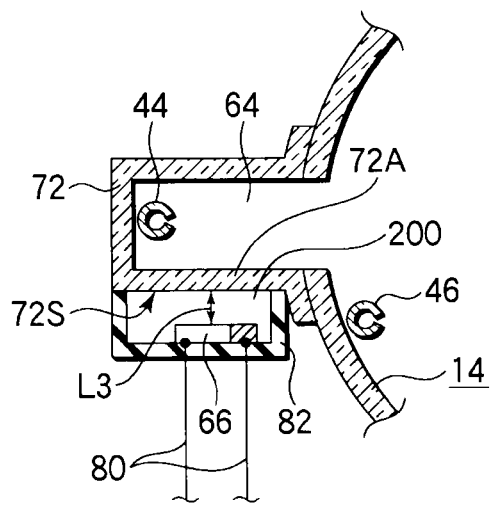
FIG. 17 is an enlarged sectional view showing part of the plasma generation box of the apparatus shown in FIG. 16.
Figure 18:
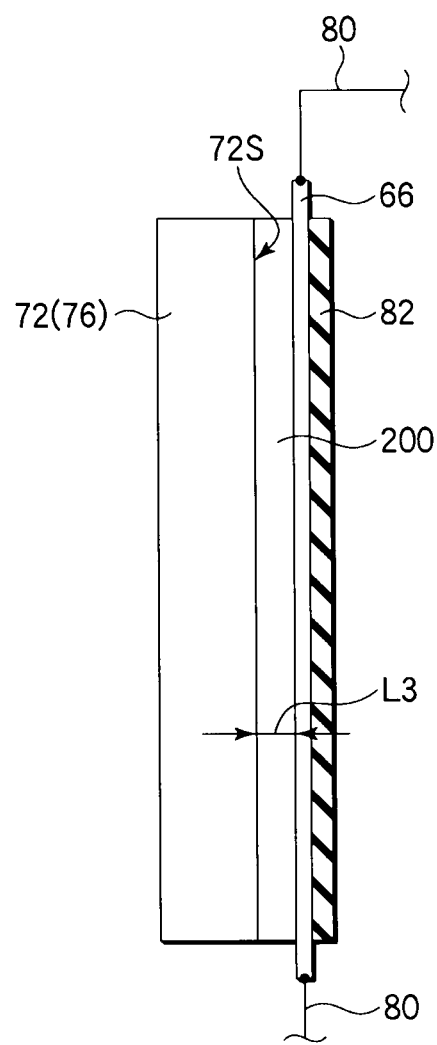
FIG. 18 a schematic side view showing the relationship between the cover of the plasma generation box of the apparatus shown in FIG. 16 and an electrode attached thereto.

FIG. 16 is a schematic perspective view showing a main portion of a plasma processing apparatus according to a fifteenth embodiment of the present invention. FIG. 17 is an enlarged sectional view showing part of the plasma generation box of the apparatus shown in FIG. 16. FIG. 18 a schematic side view showing the relationship between the cover of the plasma generation box of the apparatus shown in FIG. 16 and an electrode attached thereto. In the first to fourteenth embodiments, the electrodes 66 and 66-1 are set in contact with the outer surface of the wall of the cover 72. On the other hand, in the fifteenth embodiment shown in FIGS. 16 to 18, the electrodes 66 and 66-1 are entirely or partly separated from the outer surface of the wall of the cover.

An explanation will be given of this reason. Specifically, when an RF power is applied to the electrode of the plasma generation box 64, a standing wave is generated inside the plasma generation box 64, but this standing wave may be non-uniform in some cases. In such cases, the intensity of the electromagnetic field is entirely or locally higher, and causes ions to be accelerated at the corresponding portion and sputter the inner surface of the cover, thereby increasing particle generation and metal contamination. In order to prevent such a phenomenon, all or part of the electrode is set slightly separated from the outer surface of the wall of the cover, as described above. At the portions where the electrode is separated, the intensity of the capacitive electromagnetic field formed inside the plasma generation box becomes lower.

Specifically, as shown in FIGS. 16 to 18, the fifteenth embodiment is arranged on the basis of the first embodiment. The electrode 66 is set out of contact with or slightly separated from the outer surface 72S of the sidewall 72A of the cover 72, so that a gap 200 with a uniform size is formed between the outer surface 72S and electrode 66. In this case, when an RF power is applied to the electrode 66, an electromagnetic field is formed with a slightly lower intensity inside the plasma generation box 64.

In this embodiment, a quartz insulating plate 82 having a U-shape cross section is fixed to the outer surface 72S at its opposite ends. The electrode 66 is attached to the inner surface of the U-shape insulating plate 82 and extends in the longitudinal direction thereof.

The distance L3 (the size of the gap 200) between the outer surface 72S and electrode 66 is set at a value within a range of about 0.5 to 20 mm. If the distance L3 is smaller than 0.5 mm, the intensity of the electromagnetic field formed inside the plasma generation box 64 cannot be sufficiently decreased to prevent the inner surface from being sputtered. On the other hand, if the distance L3 is larger than 20 mm, the intensity of the electromagnetic field formed inside the plasma generation box 64 is decreased too much, and the rate and uniformity of film formation are thereby deteriorated.

In the structure described above, it may be possible to decrease the electromagnetic field intensity by increasing the thickness (which is now about 4.5 to 6.5 mm) of the cover 72. However, this modification entails a difficulty in manufacturing the cover 72 and is not practical in light of the cost and manufacturing time.

All the other portions of this fifteenth embodiment may be designed as described in the first embodiment. This embodiment can also exhibit the same function and effect as the first embodiment. Further, in this fifteenth embodiment, since the electrode 66 is separated from the outer surface 72S of the cover 72 as described above, the electromagnetic field intensity inside the plasma generation box 64 is prevented from being excessively larger. Consequently, the inner surface of the cover 72 is less sputtered, thereby decreasing particle generation and metal contamination, and prolonging the service life of the process container 14.

The electrodes 66 of this embodiment may be one of those described with reference to the first to sixth embodiments. The feature of this fifteenth embodiment may be applied to any one of the seventh to fourteenth embodiment. Where this feature is applied to the tenth embodiment (see FIGS. 10A and 10B) and the fourteenth embodiment, the electrode 66 (66-1) is set separated from the outer surface of the wall portion of the process container 14 corresponding to the plasma generation box 64.

An experiment was performed in a plasma processing apparatus according to a present example of the fifteenth embodiment, while using the distance L3 as a parameter. As a result, with an increase in the distance L3, the etched amount of the inner surface of the cover 72 was gradually decreased and then saturated at several Å at when the distance L3 was about 4.5 mm. Further, until the distance L3 was increased to 20 mm, the film formation was performed without a serious hitch with this small etched amount.

Figure 19A:
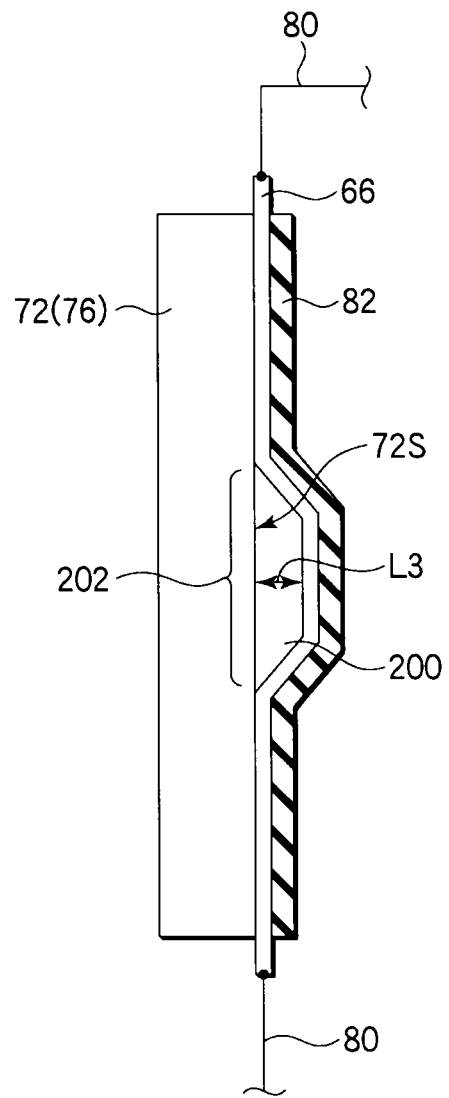
FIGS. 19A and 19B are schematic side views each showing part of modifications according to the fifteenth embodiment.

In the fifteenth embodiment shown in FIGS. 16 to 18, the entire electrode 66 is slightly separated from the outer surface 72S of the cover 72. Alternatively, only part of the electrode 66 may be separated from the outer surface 72S, as shown in the modifications of FIGS. 19A and 19B.

Where the entire electrode 66 is set in contact with the outer surface 72S, the electromagnetic field intensity may be locally higher inside the plasma generation box 64 and bring about excessive sputtering on part of the inner surface of the cover 72. In light of this, the electrode 66 is partly separated from the outer surface 72S at portions that suffer the excessive sputtering. FIGS. 19A and 19B are schematic side views each showing part of modifications according to the fifteenth embodiment;

FIG. 19A shows a case in which the sputtered amount of the inner surface is larger at a central area 202 in the longitudinal direction of the cover 72. In this case, the electrode 66 is set separated from the outer surface 72S by a distance L3 only at the portion corresponding to the central area 202 while it is set in contact with the outer surface 72S at the other portions. With this arrangement, the capacitive electromagnetic field formed inside the plasma generation box 64 (see FIG. 17) becomes lower at the central area 202, so that the inner surface is less etched.

Figure 19B:
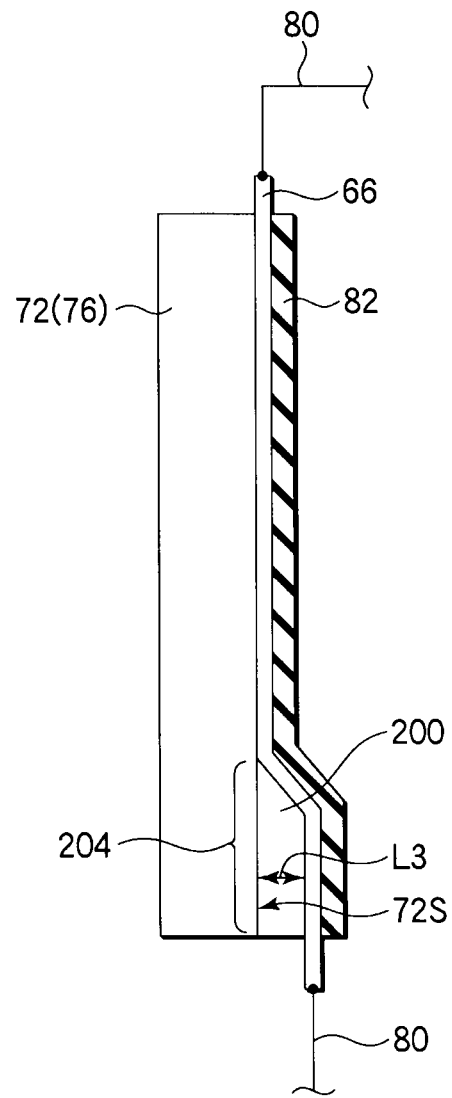

FIG. 19B shows a case in which the sputtered amount of the inner surface is larger at a lower area 204 in the longitudinal direction of the cover 72. In this case, the electrode 66 is set separated from the outer surface 72S by a distance L3 only at the portion corresponding to the lower area 204 while it is set in contact with the outer surface 72S at the other portions. With this arrangement, the capacitive electromagnetic field formed inside the plasma generation box 64 (see FIG. 17) becomes lower at the lower area 204, so that the inner surface is less etched.

The portions of the cover 72 to be excessively sputtered are changed, depending on the frequency and so forth of the applied RF power. Accordingly, the separated portions of the electrode 66 are not limited to the central area 202 or lower area 204 of the cover 72. The feature of this modification may be applied to any one of the first to fourteenth embodiments.

It should be noted that the exhaust port 62 formed in the process container 14 and the exhaust port cover 84 used in the eleventh to fifteenth embodiments are the same as those of the first embodiment and thus are not shown in the drawings.

<Other Modifications>

Where a plurality of electrodes 66 and 66-1 are used, these electrodes may have the same meandering shape or different meandering shapes. The two gas distribution nozzles 44 and 44-1 may be configured to supply different gases. In place of a meandering shape, the electrode may be formed of a width and straight plate electrode with a width of several to several tens of millimeters.

The film formation process is exemplified by a silicon nitride film, but the type of a film to be formed is not limited to a specific one. The plasma process is exemplified by a film formation process of the plasma ALD type. Alternatively, the present invention may be applied to any one of the processes using plasma, such as a plasma CVD process, plasma reformation process, plasma oxidation/diffusion process, plasma sputtering process, or plasma nitridation process.

The target object is exemplified by a semiconductor wafer, which may be a silicon substrate or a compound semiconductor substrate, such as GaAs, SiC, or GaN. Alternatively, the present invention may be applied to another target object, such as a glass substrate for LCD devices, or ceramic substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vertical plasma processing apparatus for performing a plasma process on a plurality of target objects together at a time, the apparatus comprising:
a vertically elongated process container having a process field configured to accommodate the target objects and to be set in an airtight state;
a holder configured to stack thereon the target objects at intervals in a vertical direction within a holding span having a predetermined vertical length inside the process field;
a gas supply system configured to supply a process gas into the process container;
an exhaust system configured to exhaust gas from inside the process container; and
an activation mechanism configured to turn the process gas into plasma,
wherein the activation mechanism includes
a vertically elongated plasma generation box attached to outside the process container and extending vertically entirely over the process field and confining a plasma generation area airtightly communicating with the process field,
an inductively coupled plasma ICP electrode disposed outside the plasma generation box to generate inductively coupled plasma of the process gas in the plasma generation area, and
a radio frequency RF power supply connected to the ICP electrode, and
wherein
the plasma generation box includes an opening having a vertical length entirely over the holding span and connecting the plasma generation area to the process field,
the plasma generation box having a vertically elongated shape formed by first and second sidewalls extending outward from the process container in a radial direction, the first and second sidewalls disposed on either side of the opening and facing each other, and a backside wall connecting outer ends of the first and second sidewalls to each other,
the gas supply system includes a gas distribution nozzle disposed inside the plasma generation box and including a plurality of gas spouting holes arrayed in a vertical direction to laterally spout the process gas toward the process field, the gas distribution nozzle being disposed to deliver the process gas directly inside the plasma generation box such that the process gas is supplied to the process field through a position inside the plasma generation box corresponding to the ICP electrode, and the ICP electrode is an electrode band extending in a vertical direction along only one of the first and second sidewalls of the plasma generation box, the electrode band including a meandering part defined by a plurality of bent portions alternately bent in opposite directions along only said one of the first and second sidewalls of the plasma generation box vertically entirely over the holding span, the meandering part having a meandering width set not to reach the position corresponding to the gas distribution nozzle, such that plasma generated inside the plasma generation box is not in contact with the gas nozzle.

2. The apparatus according to claim 1, wherein the ICP electrode is grounded at one end through a matching circuit and is connected at another end to the RF power supply through the matching circuit.

3. The apparatus according to claim 1, wherein the plasma generation box comprises a plurality of plasma generation box units attached to the process container and separated from each other, and the ICP electrode comprises a plurality of electrode units corresponding to the plasma generation box units and connected to each other in series.

4. The apparatus according to claim 1, wherein the ICP electrode includes a separated portion separated from a wall surface of the plasma generation box by a predetermined distance and the separated portion of the ICP electrode is set at a position corresponding to an area where an electromagnetic field formed inside the plasma generation box by an RF power applied from the RF power supply is larger as compared with other areas.

5. The apparatus according to claim 4, wherein the predetermined distance is set at a value within a range of 0.5 to 20 mm.

6. The apparatus according to claim 4, wherein the ICP electrode is entirely separated from a wall surface of the plasma generation box by the predetermined distance.

7. The apparatus according to claim 1, wherein the bent portions comprise an arc shape.

8. The apparatus according to claim 1, wherein the bent portions comprise a shape of a cycloid curve or sine curve.

9. The apparatus according to claim 1, wherein the bent portions comprise an elliptic arc shape.

10. The apparatus according to claim 1, wherein the bent portions are each formed by two straight line portions connected to each other at a predetermined angle.

11. The apparatus according to claim 1, wherein the ICP electrode comprises a shape alternately combining the bent portions and straight line portions.

12. The apparatus according to claim 1, wherein the bent portions respectively form circular arcs having substantially a constant radius.

13. The apparatus according to claim 12, wherein each of the circular arcs is formed of a circular arc cut out by an angle of $\pi/2$ to $3\pi/2$ from a circle having the radius.

14. The apparatus according to claim 12, wherein the electrode band of the ICP electrode has a width of 2 to 10 mm and meanders to form the circular arcs.

15. The apparatus according to claim 14, wherein the radius is 5 to 50 mm.

16. The apparatus according to claim 1, wherein the plasma generation box has a width of 20 to 50 mm defined by a distance between inner surfaces of the first and second sidewalls.

17. The apparatus according to claim 1, wherein the plasma generation box protrudes from the process container by a length of 50 to 120 mm in the radial direction.

* * * * *